United States Patent
Sharma

(10) Patent No.: US 6,956,271 B2
(45) Date of Patent: Oct. 18, 2005

(54) SWITCHING OF SOFT REFERENCE LAYERS OF MAGNETIC MEMORY DEVICES

(75) Inventor: Manish Sharma, Sunnyval, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 60 days.

(21) Appl. No.: 10/776,580

(22) Filed: Feb. 11, 2004

(65) Prior Publication Data

US 2005/0173771 A1    Aug. 11, 2005

(51) Int. Cl.⁷ .............................................. H01L 29/82
(52) U.S. Cl. .............................. 257/421; 257/E27.006; 257/295
(58) Field of Search ...................... 257/421, E27.006, 257/295

(56) References Cited

U.S. PATENT DOCUMENTS

| | | |
|---|---|---|
| 5,224,068 A | 6/1993 | Miyake et al. |
| 5,396,455 A | 3/1995 | Brady et al. |
| 5,444,651 A | 8/1995 | Yananoto et al. |
| 5,640,343 A | 6/1997 | Gallagher et al. |
| 5,761,110 A | 6/1998 | Irrinki et al. |
| 5,933,365 A | 8/1999 | Klersy et al. |
| 5,936,882 A | 8/1999 | Dunn |
| 5,953,245 A | 9/1999 | Nishimura |
| 5,956,295 A | 9/1999 | Yamakawa et al. |
| 6,016,290 A | 1/2000 | Chen et al. |
| 6,404,674 B1 * | 6/2002 | Anthony et al. ............ 365/173 |

OTHER PUBLICATIONS

Hewlett-Packard published application No. 20020089874, serial 758757, filed Jul. 11, 2002 Thermally-assisted switching of magnetic memory elements, Nikel, et al.
Hewlett-Packard published U.S. Pat. No. 20030123282, serial 315748, filed Jul. 3, 2003 Thermally-assisted switching of magnetic memory elements, Nikel, et al.
Ryan, Mason & Lewis, LLP published U.S. Pat. No. 20030198113, serial 128838, filed Oct. 23, 2003 Memory storage device with heating element, Abraham, David W.; et al.

* cited by examiner

Primary Examiner—David Nelms
Assistant Examiner—Tu-Tu Ho

(57) ABSTRACT

A magnetic random access memory (MRAM) including an array of magnetic memory cells and a plurality of word and bit lines connecting columns and rows of the memory cells. Each memory cell has a magnetic reference layer and a magnetic data layer. Each reference layer and each data layer has a magnetization that is switchable between two states under the influence of a magnetic field. The MRAM also includes a plurality of heating elements each proximate to a respective reference layer. Each heating element provides in use for localized heating of the respective reference layer so as to reduce the coercivity of the reference layer to facilitate switching of the reference layer without switching of the data layers.

15 Claims, 4 Drawing Sheets

SWITCHING OF SOFT REFERENCE LAYERS OF MAGNETIC MEMORY DEVICES

FIELD OF THE INVENTION

The present invention relates to magnetic memory devices having soft reference layers, and more specifically to techniques for switching of the soft reference layers.

BACKGROUND OF THE INVENTION

Non-volatile memory devices such as magnetic random access memory (MRAM) devices are of interest for replacement of volatile memory devices such as dynamic random access memory (DRAM) devices. Such MRAM devices include an array of individual MRAM cells which may be tunnelling magnetoresistance memory (TMR) cells, colossal magnetoresistance memory cells (CMR) or giant magnetoresistance memory (GMR) cells.

In general, the MRAM cells include a data layer and a reference layer. The data layer is composed of a magnetic material and during a write operation the magnetisation of the data layer can be switched between two opposing states by an applied magnetic field and thus binary information can be stored. The reference layer often is composed of a magnetic material in which the magnetisation is pinned so that the magnetic field that is applied to the data layer and in part penetrates the reference layer, is of insufficient strength to switch the magnetisation in the reference layer.

For example in a TMR cell the data layer and the reference layer are separated by a thin dielectric layer which is arranged so that a tunnelling junction is formed. Any material comprises two types of electrons which have spin-up and spin down polarity. In the case of a ferromagnetic layer that has a magnetization, more electron spins have one orientation compared with the other one which gives rise to the magnetization. The electrical resistance through the layers is dependent on the relative orientations of the magnetizations in the data and reference layers. This is the tunneling magneto-resistance (TMR) effect and the state of the data layer can be read by measuring the apparent electric resistance across the layers.

The data layer comprises a low coercivity material that can be switched in its magnetic direction by a megnetic field generated by column and row data-write current.

The reference layer usually is fabricated with a high coercitivity material and is permanently magnetized in a set direction during an annealing process step. In one version of the memory cell, namely the "spin-valve", the reference layer is "pinned" by exchange coupling by an adjacent antiferromagnetic layer. In such a spin-valve, the orientation of the magnetization of the pinned reference layer remains substantially fixed.

In an alternative design the reference layer is soft-magnetic and has a lower coercivity so that the reference layer can be switched together with the data layer. In this case the magnetic field of a control current is used to switch the magnetization of the reference layer to the reference state after the data layer is switched. The coercivity of the reference layer and the magnitude of the control current need to be chosen so that switching the reference layer does not affect the data layer. In order to make switching of the reference layer easier and to reduce the magnitude of control currents required for switching the reference layer, it is of advantage that the coercivity of the soft reference layer is as low as possible. However, reference layers with low coercivities are difficult to fabricate. Hence, there is a need for a magnetic memory device in which switching of the soft reference layer is facilitated.

SUMMARY OF THE INVENTION

Briefly, a magnetic random access memory (MRAM) embodiment of the present invention includes an array of magnetic memory cells. A plurality of word and bit lines connects columns and rows of the memory cells. Each memory cell has a magnetic reference layer and a magnetic data layer. Each reference layer and each data layer has a magnetization that is switchable between two states under the influence of a magnetic field. The MRAM also includes a plurality of heating elements each proximate to a respective reference layer. Each heating element provides in use for localized heating of the respective reference layer so as to reduce the coercivity of the reference layer to facilitate switching of the reference layer without switching of the data layers.

The present invention will be more fully understood from the following description of specific embodiments. The description is provided with reference to the accompanying drawings.

DETAILED DESCRIPTION

Figure 1:
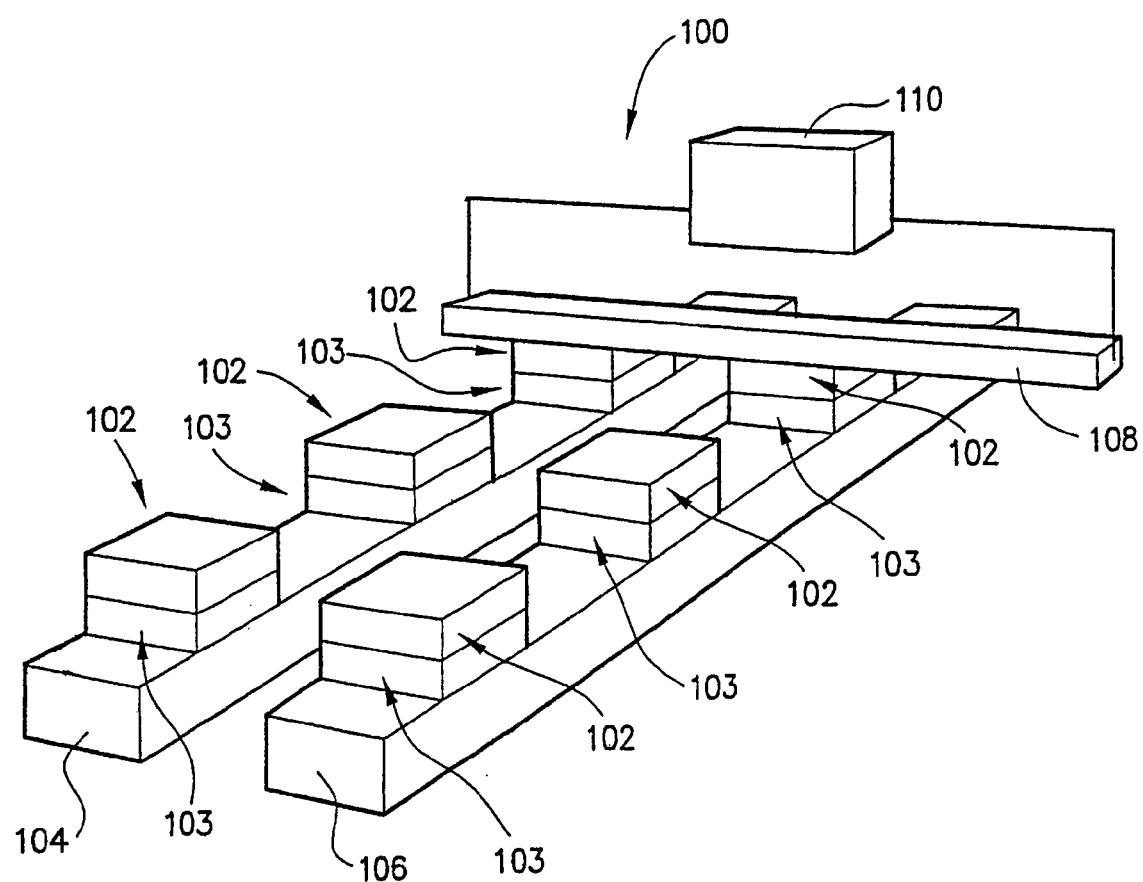
FIG. 1 is a perspective diagram of a magnetic memory device according to a specific embodiment.

FIG. 1 represents a magnetic random access memory (MRAM) array embodiment of the present invention, and is referred to herein by the general reference numeral 100. The MRAM 100 includes an array of magnetic memory cells 102 and electrical heaters 103 in a cross-point arrangement. In this embodiment, each memory cell 102 is based on tunneling magneto resistance (TMR) technology in which tunneling currents tunnel through a dielectric layer affected by local magnetic fields. Individual cells 102 are selectively addressed for read-write access by word lines 104 and 106, and bit lines 108. These word and bit lines represent hundreds of such lines that constitute and implement the cross-point array.

Each magnetic memory cell 102 has a soft-magnetic data layer and a soft-magnetic reference layer. When a data-write current is applied to bit line 108, a magnetic field will surround it. The magnetic field is used to switch the magnetic memory cells 102 by switching the permanent-magnet data layer to the opposite polarization. Binary information can therefore be stored as a function of the direction of the magnetic field generated by the current applied to bit line 108. The magnetic field will usually also switch the magnetization of the reference layer. After the write operation, a control current is directed through respective word lines such as 104 and 106 to generate a further magnetic field which will ensure that the magnetization of the reference layer has a predetermined reference state. The coercivity of the reference layer is temperature dependent and the heaters 103 generate heat which lowers the coercivity of the reference layers and therefore facilitate switching of their magnetization. Therefore, the control current can be lower and/or the intrinsic coersivity of the reference layer can be higher than for devices which do not have heaters 103 which has practical advantages for the fabrication of the MRAM devices.

FIG. 1 includes a data-write generator 110 that outputs a data-write current through bit line 108. The circuit may also generate a current through word lines 104 and 106. (Electrical connections to the data-write generator 110 are not shown for word lines 104 and 106).

Although not illustrated in FIG. 1, MRAM 100 typically includes a read circuit for sensing the resistance of selected memory cells 102. During read operation, a constant voltage is applied to the bit line 110 and sensed by the read circuit. An external circuit may provide the constant supply voltage.

MRAM 100 may include an array having any number of memory cells 102 arranged in any number of rows and columns. It can also use alternative technologies such as colossal magneto-resistance memory cells (CMR), and giant magneto-resistance memory (GMR) cells.

Figure 2:
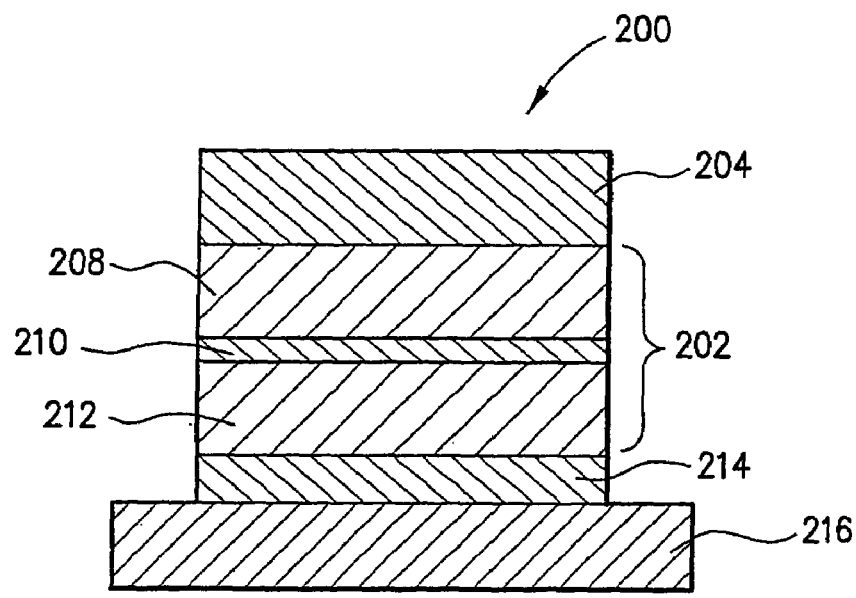
FIG. 2 is a schematic cross-sectional diagram of a magnetic memory device according to another specific embodiment.

FIG. 2 shows a cross-sectional diagram of the memory cell 202 contacted by the bit line 204. The memory cell 202 comprises a data layer 208, a thin dielectric layer 210 and a reference layer 212. In general, MRAM 200 is such that the magnetization in the data layer 208 can have two opposing directions so that binary information can be stored as a function of the direction of the magnetic field generated by the current applied to bit line 204.

The data layer 208 uses a magnetic material with a direction of magnetization that can be switched as a function of an applied magnetic field. The reference layer 212 is a soft magnetic layer and has a coercivity that is lower than that of the data layer 208.

In this embodiment a further layer 214 is positioned between the reference-layer 212 and the word line 216. Layer 214 may be a dielectric layer so that, when a potential is applied between the word line 204 and the bit line 216 a tunneling current will flow through the dielectric layer 214 which will result in the generation of heat. Alternatively, layer 214 may be a resistive layer composed of a material that has a relatively low electrical conductivity and heat may be generated resistively without a tunneling current through the layer. In any case, the generated heat diffuses at least in part into the reference layer 212.

Typically further layers are positioned between the reference layer 212 and the word line 216 which are not shown in order to improve clarity. For example, the layer 214 may be separated by one or more of these layer from the reference layer 212 and/or the word line 216.

When the magnetization of the data layer 208 is switched, the magnetization of the soft-magnetic reference layer 212 typically will also switch. After a switching operation a control current will be directed through word line 216. Owing to the heat generated by layer 214, the coercivity of the reference layer and therefore the magnetic field strength required to switch the magnetization of reference layer 214 is reduced and thus switching of the reference layer supported.

The thin dielectric layer 210 is thin enough so that a tunneling current will flow through the dielectric layer when a suitable electrical potential is applied. The tunneling probability, and therefore the impedance of the memory cell, depends on the direction of the magnetization in the data layer 210 relative to that of the reference layer 208. Therefore, to determine the orientation of the magnetization in the data layer from the tunneling current which is dependent on the resistance of the memory cell 102.

In this particular example the data layer 208 is composed of nickel iron (NiFe) and the reference layer 212 is a thin ferro-magnetic layer and composed of NiFe. The dielectric layer 210 is composed of $AL_2O_3$. All layers have the same planar area of approximately 130 nm×260 nm, and the reference layer 212, the data layer 208 and the dielectric layer 210 have a thickness of approximately 2 nm, 4 nm, and 2 nm, respectively. The resistances of layers 210 and 214 are approximately the same. Therefore, the device comprises two heat sources that develop approximately the same amount of heat. In this example bit and word lines ar composed of copper.

If the layer 214 is a dielectric layer through which in use a tunneling current passes, the layer 214 may have a thickness ranging from 0.5 nm to 10 nm and may be composed of any suitable dielectric material including for example aluminum oxide oxide ($Al_2O_3$), aluminum nitride (AlN), silicon oxide ($SiO_2$), silicon nitride ($Si_3N_4$), boron nitride (BN), Magnesium oxide (MgO), tantalum oxide ($Ta_2O_5$, or in general $TaO_5$) and many others. In this example the layer has a thickness of 2 nm and a planar area of 130×260 nm.

If the layer 214 is a resistive layer it may be composed of any suitable resistive material including semiconductors (e.g., Si, Ge, Se, graphite, Carbon, SiC), some conductive oxides (e.g. $TaO_2$), silicides (e.g., WSi, CoSi, FeSi, PtSi), nitrides (e.g., TaN, FeAlN, SiN).

Figure 3:
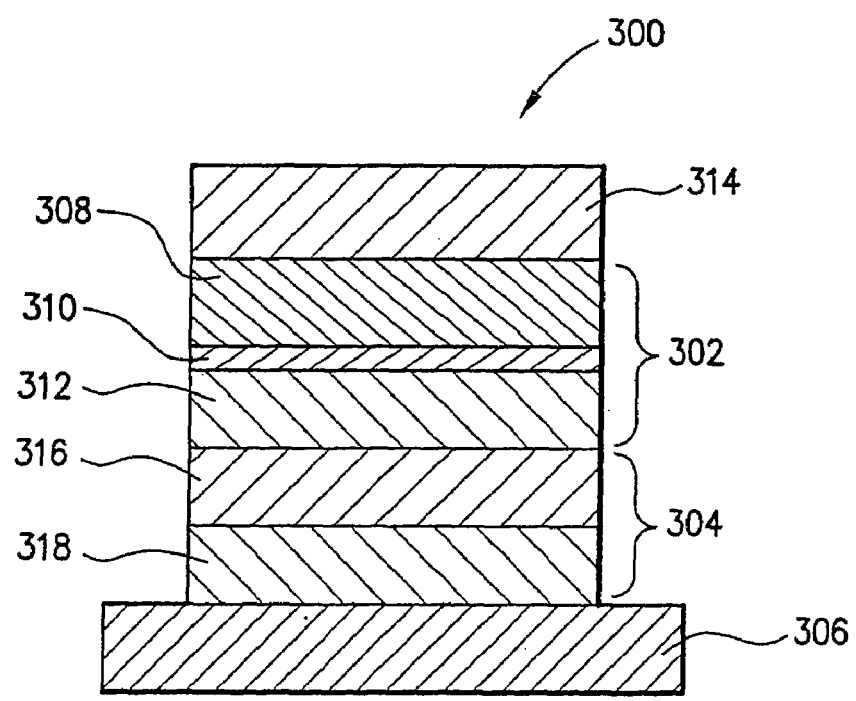
FIG. 3 is a schematic cross-sectional diagram of a magnetic memory device according to a further specific embodiment.

FIG. 3 shows a cross-sectional representation a portion of device 300. An electrical heater is positioned in the proximity of magnetic memory cell 302 which in this embodiment is a thin film diode 304. Diode 304 is sandwiched between word line 306 and memory cell 302. The memory cell 302 comprises data layer 308, dielectric layer 310 and reference layer 312. As for MRAM 200 shown in FIG. 2 and discussed above, the reference layer 312 is a soft magnetic layer and has a coercivity that is lower than that of the data layer 308.

The magnetic memory cell 302 is contacted by bit line 314. When a potential is applied between the word line 314 and the bit line 306 a current will flow through the diode 304 which will result in the generation of resistive heat that at least in part diffuses into the reference layer 312 and supports switching of the reference layer 312. The resistance of the diode 304 and therefore the heat that is generated depends on the operating conditions. For example, when the diode is reverse biased, the resistance will be relatively high whereas the resistance is lower when the diode is forward biased.

Typically further layers are positioned between the reference layer 312 and the word line 306 which are not shown in order to improve clarity. For example, the diode 304 may be separated by one or more of these layer from the reference layer 312 and/or the word line 306.

The device 300 shown in FIG. 3 is similar to the device 200 shown in FIG. 2. The data layer 308 is composed of nickel iron (NiFe), the reference layer 312 is a soft magnetic reference layer and is composed of NiFe and the dielectric layers 310 is composed of $AL_2O_3$. All layers have the same planar area of approximately 130 nm×260 nm, and the reference layer 312, the data layer 308 and the dielectric layer 310 have a thickness of approximately 2 nm, 4 nm, and 2 nm, respectively.

The diode 304 diode may be a conventional p-n junction and may also be a metal-semiconductor (Schottky diode) such as Pt—Si diode. The diode 304 may also be incorporated into the substrate (ie into a silicon substrate). In this embodiment, the diode 304 comprises single-crystal silicon and is fabricated in the substrate level. An alternative fabrication procedure involves making an amorphous-silicon based diode. In this case the silicon can be deposited by using PECVD, CVD techniques as a thin layer within the multiple metal layers of the MRAM cell.

As device 100 shown in FIG. 1, devices 200 and 300 typically include read circuits for sensing the resistance of selected memory cells. During read operations, a constant voltage is applied to the bit lines and sensed by the read circuit. An external circuit may provide the constant supply voltage.

MRAMs 200 and 300 may comprise an array having any number of memory cells arranged in any number of rows and columns. They can also use alternative technologies such as colossal magneto-resistance memory cells (CMR), and giant magneto-resistance memory (GMR) cells.

Figure 4:
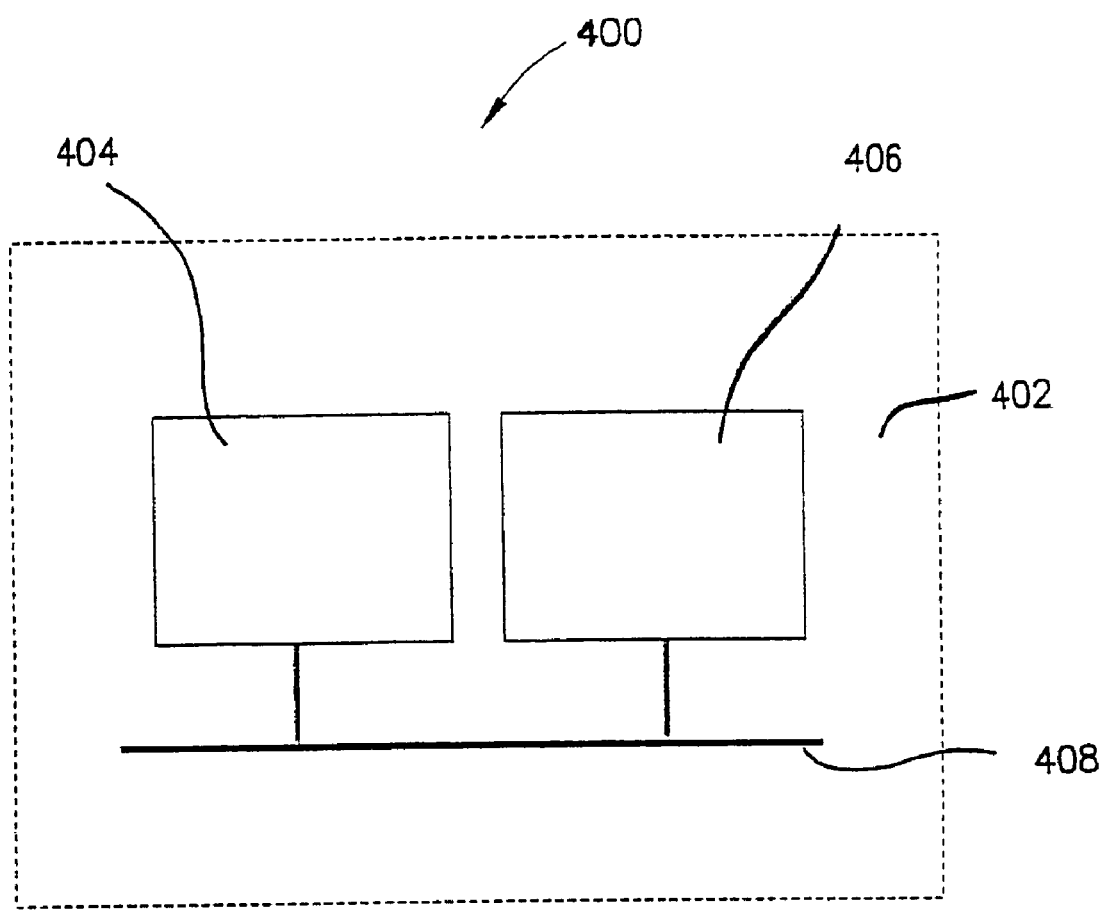
FIG. 4 is a schematic diagram of a computer system embodying the device shown in FIG. 1.

FIG. 4 shows a computer system 400 which embodies the memory device shown in FIG. 1. The computer system 400 has a main board 402 which is connected to a central processing unit 404 and magnetic memory device 406. The magnetic memory device arrays 406 includes the device shown in FIG. 1. The magnetic memory device array 406 and the central processing unit 404 are connected to a common bus 408. The computer system 404 has a range of further components which are for clarity not shown.

Figure 5:
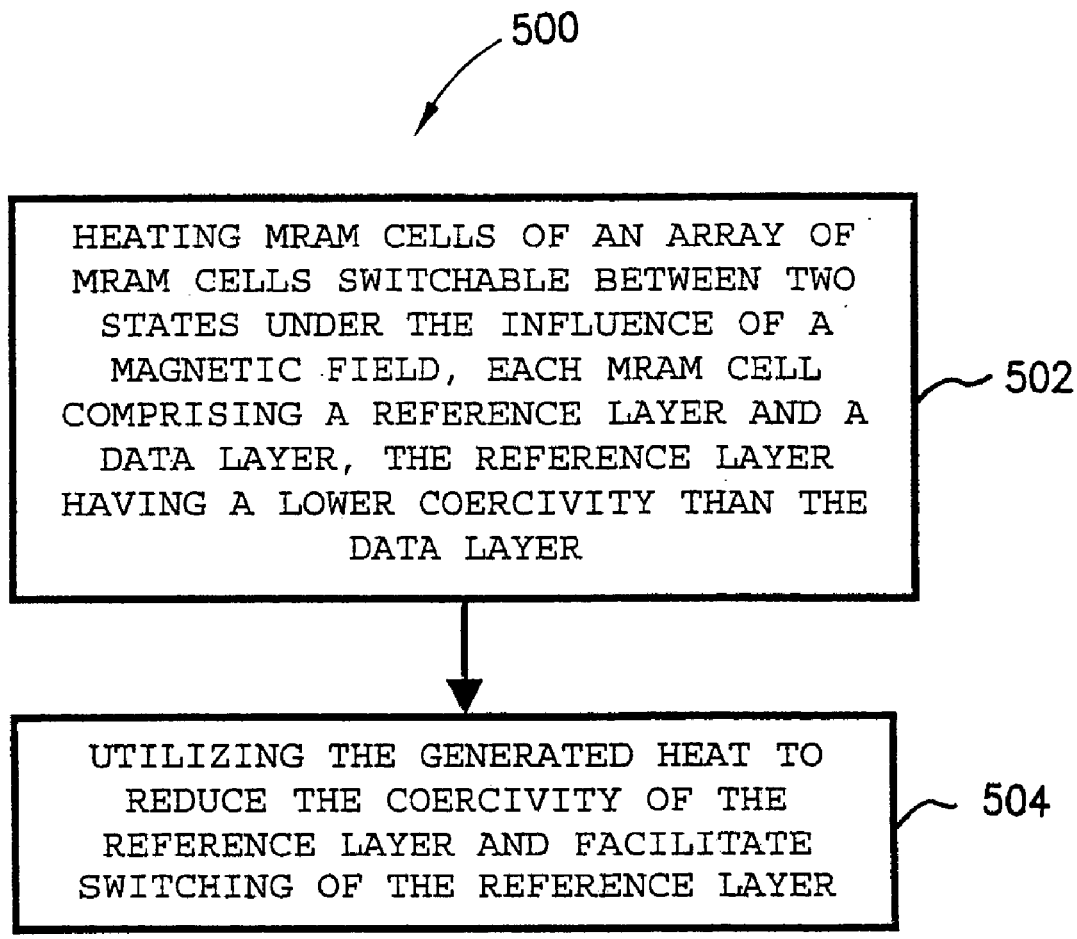
FIG. 5 is a flow-chart for a method embodiment.

FIG. 5 illustrates a method embodiment for operating an MRAM device. The method 500 comprises step 502 of heating MRM cells, such as those shown in FIG. 1. The method 500 includes step 504 of utilizing the generated heat to facilitate cell state switching of the reference layer.

Although the invention has been described with reference to particular examples, it is to be appreciated by those skilled in the art that the invention may be embodied in many other forms. For example, the MRAM device may comprise more than one heater for each MRAM cell. In addition, further layers may be disposed between the memory cell and the heater or between the heater and the word line. In this case the magnetic memory cell may be electrically isolated form the bit and/or word lines. For example, a sense conductor may be in electrical contact with the memory cell (ie with the data layer) and an electrically insulating layer may be disposed between the bit line and the sense layer. Further, each magnetic memory cell may comprise a number of additional layers such as capping, AF and seed layers.

In addition the soft reference layer of each memory cell may include a respective word line. For example, a conductive core may carry the read and control currents. The core may be cladded with a ferromagnetic material that has a low coercivity. If the MRAM device comprises TMR cells, the cladded core may be positioned adjacent the dielectric layer of a respective TMR cell so that a current may tunnel between the cladding and the data layer through the dielectric layer.

What is claimed is:

1. A magnetic random access memory (MRAM) device comprising:
   an array of magnetic memory cells;
   a plurality of word and bit lines connecting columns and rows of the memory cells, each memory cell having a magnetic reference layer and a magnetic data layer, each reference layer and each data layer having a magnetization being switchable between two states under the influence of a magnetic field; and
   a plurality of heating elements each proximate to a respective reference layer, each heating element in use providing for localized heating of the respective reference layer so as to reduce the coercivity of the reference layer to facilitate switching of the reference layer without switching of the data layers.

2. The MRAM of claim 1, wherein:
   each reference layer has at a first temperature a coercivity that is lower than that of each data layer at the first temperature.

3. The MRAM of claim 1, wherein:
   each heating element is a heat-inducing layer.

4. The MRAM of claim 3, wherein:
   each heat-inducing layer is a resistive layer.

5. The MRAM of claim 3, wherein:
   each heat inducing-layer is a dielectric layer through which in use a tunneling current is directed.

6. The MRAM of claim 1, wherein:
   each heating element is a diode.

7. The MRAM of claim 4, wherein:
   the resistive layer comprises at least one of of the materials Si, Ge, Se, C, SiC, $TaO_2$, WSi, CoSi, FeSi, PtSi, TaN, FeAlN and SiN.

8. The MRAM of claim 5, wherein:
   the dielectric layer comprises at least one of the materials $Al_2O_3$, AlN, $SiO_2$, $Si_3N_4$, BN, MgO and $Ta_2O_5$.

9. The MRAM of claim 6, wherein:
   the diode comprises at least one of amorphous silicon and single crystalline silicon.

10. The MRAM of claim 1, wherein:
    each memory device is a tunneling magneto-resistance (TMR) memory device.

11. A computer system comprising:
    a central processing unit,
        a main board coupled to the central processing unit and magnetic memory devices coupled to the main board, each magnetic memory device comprising:
        an array of magnetic memory cells;
        a plurality of word and bit lines connecting columns and rows of the memory cells, each memory cell having a magnetic reference layer and a magnetic data layer, each reference layer and each data layer having a magnetization being switchable between two states under the influence of a magnetic field; and
        a plurality of heating elements each proximate to a respective reference layer and in use providing for localized heating of the respective reference layer so as to reduce the coercivity of the reference layer to facilitate switching of the respective reference layer without switching of the data layers.

12. A method for operating an MRAM device the device comprising an array of MRAM cells switchable between two states under the influence of a magnetic field, each MRAM cell having a reference layer and a data layer, the method comprising the steps of:
    heating at least one reference layer; and
    utilizing the generated heat to reduce the coercivity of the at least one reference layer and facilitate switching of the at least reference layer without switching of the data layers.

13. The method of claim 12, wherein:
    the step of heating of the at least one reference layer comprises directing a current through a heat- inducing layer.

14. The method of claim 12, wherein:
    the step of heating the at least one reference layer comprises directing a current through a resistive heat-inducing layer.

15. The method of claim 12, wherein:
    the step of heating the at least one reference layer comprises directing a tunneling current through a dielectric layer.

* * * * *